United States Patent
Hirakata et al.

(10) Patent No.: US 7,626,198 B2
(45) Date of Patent: Dec. 1, 2009

(54) NONLINEAR ELEMENT, ELEMENT SUBSTRATE INCLUDING THE NONLINEAR ELEMENT, AND DISPLAY DEVICE

(75) Inventors: Yoshiharu Hirakata, Kanagawa (JP); Junichiro Sakata, Kanagawa (JP); Hisao Ikeda, Kanagawa (JP); Yuji Iwaki, Kanagawa (JP); Takahiro Kawakami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 308 days.

(21) Appl. No.: 11/371,520

(22) Filed: Mar. 9, 2006

(65) Prior Publication Data

US 2006/0214158 A1    Sep. 28, 2006

(30) Foreign Application Priority Data

Mar. 22, 2005 (JP) ............................ 2005-082515

(51) Int. Cl.
*H01L 51/10* (2006.01)
(52) U.S. Cl. .................... 257/40; 257/E51.011; 345/91
(58) Field of Classification Search ................ 257/40, 257/E25.008, E51.006, E51.008, E51.011, 257/E51.015; 345/91
See application file for complete search history.

(56) References Cited

U.S. PATENT DOCUMENTS

| | | | | |
|---|---|---|---|---|
| 5,783,292 A | * | 7/1998 | Tokito et al. ................ 428/212 |
| 6,091,382 A | * | 7/2000 | Shioya et al. ................. 345/76 |
| 2003/0234609 A1 | * | 12/2003 | Aziz et al. ................... 313/504 |
| 2005/0084712 A1 | | 4/2005 | Kido et al. | |
| 2005/0098207 A1 | | 5/2005 | Matsumoto et al. | |
| 2005/0170208 A1 | | 8/2005 | Yatsunami et al. | |
| 2005/0248267 A1 | | 11/2005 | Gyoutoku et al. | |
| 2006/0008740 A1 | | 1/2006 | Kido et al. | |

FOREIGN PATENT DOCUMENTS

| | | |
|---|---|---|
| EP | 1524706 | 4/2005 |
| EP | 1530245 | 5/2005 |
| EP | 1617493 | 1/2006 |
| JP | 7-7851 B2 | 1/1995 |
| JP | 9-063771 | 3/1997 |
| JP | 11-307259 | 11/1999 |
| JP | 2005-026121 | 1/2005 |
| WO | WO 2005/031798 A2 | 4/2005 |

* cited by examiner

*Primary Examiner*—Minh-Loan T Tran
*Assistant Examiner*—W. Wendy Kuo
(74) *Attorney, Agent, or Firm*—Cook Alex Ltd.

(57) ABSTRACT

The purpose of the present invention is to provide a nonlinear element with high productivity, which can be driven at low voltage, an element substrate including the nonlinear element, and a liquid crystal display device including the element substrate. A structure of the nonlinear element of the present invention includes a layer formed using a composite material containing an inorganic compound and an organic compound between a first electrode and a second electrode. Further, as the composite material containing the inorganic compound and the organic compound, a composite material, which exhibits nonlinear behavior in both cases of applying forward bias voltage and reverse bias voltage, is used.

34 Claims, 14 Drawing Sheets

NONLINEAR ELEMENT, ELEMENT SUBSTRATE INCLUDING THE NONLINEAR ELEMENT, AND DISPLAY DEVICE

BACKGROUND OF THE INVENTION

1. Field of the Invention

The present invention relates to a nonlinear element, an element substrate including the nonlinear element, and a display device including the element substrate. In particular, the present invention relates to a liquid crystal display device using a nonlinear element as a switching element.

2. Description of the Related Art

In recent years, it has been considered to use nonlinear elements for liquid crystal display devices. An MIM (metal insulator metal) switching element, which includes a three-layered structure formed by stacking a lower conductive thin film, an insulating thin film, and an upper conductive thin film, is known as one of the nonlinear elements.

As a conventional MIM switching element, a structure, as shown in FIG. 14, in which a lower conductive thin film 1002 is provided over a substrate 101 made from glass, an insulating thin film 1003 is provided over an entire surface, and an upper conductive thin film 1004 and a pixel electrode 1005 are provided thereover, is known (see the patent document 1).
[Patent Document 1]: Japanese Patent Application Laid-Open No. Hei 7-7851

However, in a conventional nonlinear element using an insulating thin film, since the insulating thin film has high resistivity, it has been difficult to drive the nonlinear element at low voltage.

In addition, since an insulating thin film used in a conventional nonlinear element has different resistance depending on its difference in thickness of the insulating thin film, there have been problems such as variations in characteristics of the nonlinear element, and it has been necessary to make the thickness of the insulating thin film uniform. However, it is difficult to make thicknesses of insulating thin films used for all nonlinear elements uniform, and it takes a long time to make the thicknesses uniform. Thus, there has been also a problem of reduction in productivity.

SUMMARY OF THE INVENTION

The present invention is made in view of the above problems. An object of the present invention is to provide a display device which can be driven at low voltage. Moreover, another object of the present invention is to provide a nonlinear element with high productivity, an element substrate including the nonlinear element, and a display device including the element substrate.

In an aspect of the present invention, a nonlinear element includes a composite material containing an organic compound and an inorganic compound (hereinafter, simply referred to as a composite material). Further, as the composite material used in the present invention, a composite material in which a voltage-current characteristic in the case of applying forward bias voltage and a voltage-current characteristic in the case of applying reverse bias voltage both exhibit nonlinear behavior, is used.

In another aspect of the present invention, a display device has a nonlinear element, which includes a first electrode, a layer containing a composite material formed over the first electrode, and a second electrode formed over the layer containing the composite material.

In still another aspect of the present invention, a display device has a nonlinear element, which includes a first electrode, a first layer containing a composite material formed over the first electrode, a second layer containing a composite material formed over the first layer containing the composite material, in which a concentration the composite material is different from that of the first layer, and a second electrode formed over the second layer containing the composite material.

When a nonlinear element is formed in accordance with the present invention by using a composite material containing an organic compound and an inorganic compound, in which a voltage-current characteristic in a case of applying forward bias voltage and a voltage-current characteristic in a case of applying reverse bias voltage exhibit a nonlinear property respectively, instead of using an insulating thin film, the nonlinear element can be driven at lower voltage as compared to a nonlinear element formed using an insulating thin film.

In addition, by using the composite material of the present invention, an ohmic contact can be made, making it possible to use various kinds of materials for an electrode.

In addition, since the nonlinear element used in the present invention is formed by using a composite material, in which a voltage-current characteristic in a case of applying forward bias voltage and a voltage-current characteristic in a case of applying reverse bias voltage exhibit nonlinear behavior respectively, flicker and the like caused by difference in transmittance when inverting voltage applied to a liquid crystal, can be prevented.

Moreover, since resistance of the nonlinear element used in the present invention is less affected by variations in thickness of a layer containing a composite material as compared to an insulating thin film which has been used in a conventional nonlinear element, variations in characteristics of the nonlinear element can be prevented, thereby improving reliability.

Further, for the nonlinear element of the present invention, it is possible to eliminate time, which has been required for manufacturing an insulating thin film with a uniform thickness in a conventional nonlinear element, and hence, productivity can be improved.

Furthermore, driving voltage can be reduced so that a long-life nonlinear element can be provided.

DETAILED DESCRIPTION OF THE INVENTION

Figure 1:
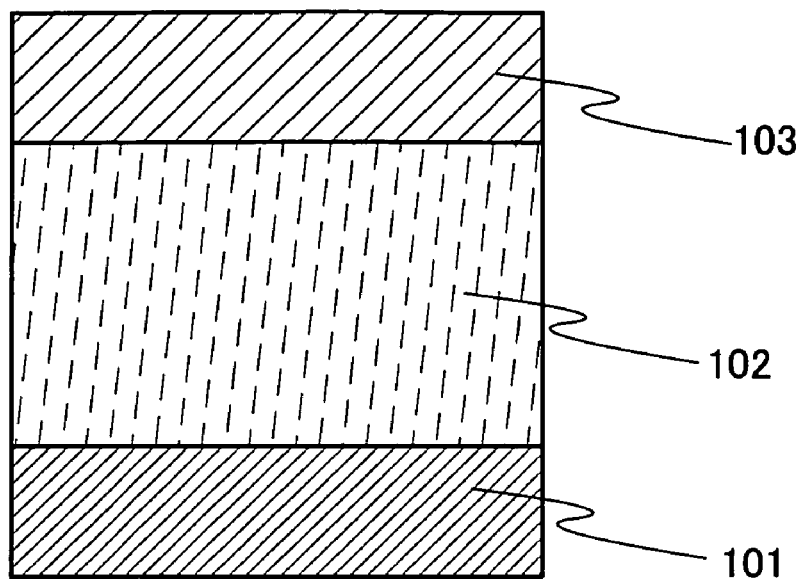
FIG. 1 is a diagram explaining a structure of a nonlinear element according to the present invention.

The best modes of the present invention will hereinafter be described with reference to the accompanying drawings. The present invention can be implemented in many different modes. It is easily understood by those skilled in the art that the embodiment modes and details herein disclosed can be modified in various ways without departing from the purpose and the scope of the invention. The present invention should not be interpreted as being limited to the description of the embodiment modes to be given below. Further, the same portions are denoted by the same reference numerals in the drawings so as to omit repetition of explanation.

EMBODIMENT MODE 1

One mode of a structure of a nonlinear element of the present invention will be described.

In this embodiment mode, an example of a structure of a nonlinear element of the present invention will be described with reference to FIG. 1. The nonlinear element of the present invention has a structure in which a layer 102 containing a composite material is provided between a first electrode 101 and a second electrode 103.

The first electrode 101 can be formed using various kinds of metal, alloys, electroconductive compounds, and mixed metal thereof. For example, indium tin oxide (ITO); indium tin oxide containing silicon oxide; or indium zinc oxide (IZO) in which 2 to 20 wt % zinc oxide (ZnO) is mixed in indium oxide; can be used. In addition, gold (Au); platinum (Pt); nickel (Ni); tungsten (W); chromium (Cr); molybdenum (Mo); iron (Fe); cobalt (Co); titanium (Ti); copper (Cu); palladium (Pd); aluminum (Al); aluminum-silicon (Al—Si); aluminum-titanium (Al—Ti); aluminum-silicon-copper (Al—Si—Cu); nitride of metal (e.g., TiN); or the like can be used.

The first layer 102 is formed using a composite material having resistivity of $5 \times 10^4$ to $1 \times 10^6$ Ωcm, and more preferably, $2 \times 10^5$ to $5 \times 10^5$ Ωcm.

Inorganic compounds which are preferably used to form a composite material of the present invention in Embodiment Mode 1, will be given below; however, the present invention is not limited thereto.

A structure of a nonlinear element of the present invention will be described. The nonlinear element of the present invention in Embodiment Mode 1 contains a composite material. Inorganic compounds exhibiting electron accepting properties with respect to an organic compound will be given here.

By using an inorganic compound, an effect of improving a heat resisting property can also be obtained. Although an inorganic compound used for the composite material is not particularly limited, transition metal oxide is preferable.

Specifically, titanium oxide, rhenium oxide, molybdenum oxide, vanadium oxide, ruthenium oxide, tungsten oxide, and the like can be given. In addition, indium tin oxide, zinc oxide, and the like can be used. Moreover, chromium oxide, zirconium oxide, hafnium oxide, tantalum oxide, silver oxide, and the like can be used. Further, an inorganic compound used for the composite material is not limited to the above mentioned materials, and other material can be used.

The above mentioned inorganic compounds exhibit electron accepting properties with respect to an organic compound. When using such an inorganic compound, holes are generated in an organic compound, and therefore, an organic compound having a hole transporting property is preferable.

As the organic compound having a hole transporting property, an organic compound having an arylamine skeleton is preferably used. Specifically, 4,4',4"-tris(N,N-diphenylamino) triphenylamine (abbreviation: TDATA); 4,4',4"-tris[N-(3-methylphenyl)-N-phenylamino] triphenylamine (abbreviation: MTDATA); 1,3,5-tris[N,N-bis(3-methylphenyl) amino] benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); 4,4'-bis(N-{4-[N,N-bis(3-methylphenyl)amino]phenyl}-N-phenylamino) biphenyl (abbreviation: DNTPD); 4,4',4"-tris(N-carbazolyl) triphenylamine (abbreviation: TCTA); poly(4-vinyltriphenylamine) (abbreviation: PVTPA); poly(N-vinylcarbazole) (abbreviation: PVK); and the like can be given. An organic compound used for the composite material is not limited thereto.

Also, aromatic amine-based (i.e., which has benzene ring-nitrogen bonds) compounds such as 4,4'-bis[N-(9,9-dimethylfluorene-2-yl)-N-phenylamino]biphenyl (abbreviation: DFLDPBi); 4,4'-bis[N-(4-biphenylyl)-N-phenylamino]biphenyl (abbreviation: BBPB); 1,5-bis(diphenylamino) naphthalene (abbreviation: DPAN); 4,4',4"-tris(N,N-diphenylamino) triphenylamine (abbreviation: TDATA); and 4,4',4"-tris[N-(3-methylphenyl)-N-phenylamino]triphenylamine (abbreviation: MTDATA), can be used. Further, an organic compound used for the composite material of the present invention is not limited to the above mentioned materials.

As an inorganic compound and an organic compound included in the composite material of the present invention, a combination of an organic compound having a hole transporting property and an inorganic compound exhibiting an electron accepting property with respect to the organic compound, is described above. However, a combination an organic compound and an inorganic compound included in the composite material of the present invention is not limited thereto, a combination of an organic compound having an electron transporting property and an inorganic compound having an electron donating property with respect to the organic compound, may be used. As the inorganic compound having an electron donating property with respect to the organic compound, oxide containing alkali metal or alkali earth metal is preferably used. Specifically, one or plural kinds selected from lithium, calcium, and barium is/are preferable. Note that an inorganic compound used for the composite material of the present invention is not limited to the materials mentioned here, and other material may be used.

The inorganic compounds mentioned above exhibit electron donating properties with respect to an organic compound. When using such an inorganic compound, electrons are generated in an organic compound, and therefore, an organic compound having an electron transporting property is preferable.

As an organic compound having an electron transporting property, an organic compound having a pyridine skeleton, an imidazole skeleton, a triazole skeleton, an oxadiazole skeleton, an oxazole skeleton, a thiazole skeleton, or the like, is preferably used. Specifically, tris(8-quinolinolato) aluminum (abbreviation: $Alq_3$); tris(4-methyl-8-quinolinolato) aluminum (abbreviation: $Almq_3$); bis(10-hydroxybenzo[h]-quinolinato) beryllium (abbreviation: $BeBq_2$); bis(2-methyl-8-quinolinolato)(4-phenylphenolato) aluminum (abbreviation: BAlq); bis[2-(2'-hydroxyphenyl) benzoxazolato]zinc (abbreviation: $Zn(BOX)_2$); bis[2-(2'-hydroxyphenyl) benzothiazolato]zinc (abbreviation: $Zn(BTZ)_2$); bathophenanthroline (abbreviation: BPhen); bathocuproin (abbreviation: BCP); 2-(4-biphenylyl)-5-(4-tert-butylphenyl)-1,3,4-oxadiazole (abbreviation: PBD); 1,3-bis[5-(4-tert-butylphenyl)-1,3,4-oxadiazole-2-yl]benzene (abbreviation: OXD-7); 2,2',2"-(1,3,5-benzenetolyl)-tris(1-phenyl-1H-benzoimidazole) (abbreviation: TPBI); 3-(4-biphenylyl)-4-phenyl-5-(4-tert-butylphenyl)-1,2,4-triazole (abbreviation: TAZ); 3-(4-biphenylyl) 4-(4-ethylphenyl)-5-(4-tert-butylphenyl)-1,2,4-triazole (abbreviation: p-EtTAZ); poly(4-vinylpyridine) (abbreviation: PVPy); and the like can be given. An inorganic compound used for the composite material of the present invention is not limited thereto.

Further, the layer 102 including a single layer is shown in FIG. 1, however, the layer 102 may includes two or more layers formed using a composite material containing the above mentioned inorganic compound and the above mentioned organic compound, wherein mixing ratios between the inorganic compound and the organic compound of the respective layers are different from each other.

As a method for manufacturing a composite material used in the present invention, for example, a co-evaporation method in which the above described organic compound and the above described inorganic compound are both evaporated by resistance heating, can be given. Also, co-evaporation may be performed by evaporating the above mentioned organic compound by resistance heating while evaporating the above mentioned inorganic compound by electron beam (EB). Further, a method in which both the above mentioned organic compound and the above mentioned inorganic compound are simultaneously stacked by evaporating the organic compound by resistance heating while sputtering the inorganic compound. In addition, the composite material may be formed by an ink-jet method, spin coating, or a wet method.

The second electrode 103 can be formed using metal, an alloy, an electrical conductive compound, a mixture thereof, and the like. As specific examples of materials for the electrode, an element belonging to Group 1 or Group 2 of the periodic table, i.e., alkali metal such as lithium (Li) and cesium (Cs); alkali earth metal such as magnesium (Mg), calcium (Ca), and strontium (Sr); and an alloy including these elements (e.g., Mg:Ag, Al:Li, or the like), can be given. Also, the second electrode 103 can be formed using various conductive materials such as a metal film (e.g., aluminum (Al), silver (Ag), or the like), and a transparent conductive film used for a pixel electrode (e.g., indium tin oxide, indium tin oxide containing silicon, or the like).

In the nonlinear element of the present invention having the above described structure, a voltage-current characteristic in a case of applying forward bias voltage and a voltage-current characteristic in a case of applying reverse bias voltage respectively show nonlinear behavior with respect to voltage applied from an external portion. Accordingly, a region where current flows in response to voltage applied from the external portion and a region where current does not flow in response to the voltage, are generated in the nonlinear element. By utilizing the switching characteristics of current, a switching operation of a pixel can be performed.

Further, since the voltage-current characteristic in the case of applying forward bias voltage and the voltage-current characteristic in the case of applying reverse bias voltage show the same nonlinear behavior, it is thought that the composite material used in the nonlinear element of the present invention makes an ohmic contact to an electrode, and therefore, various kinds of materials can be used for the electrode.

Figure 2:
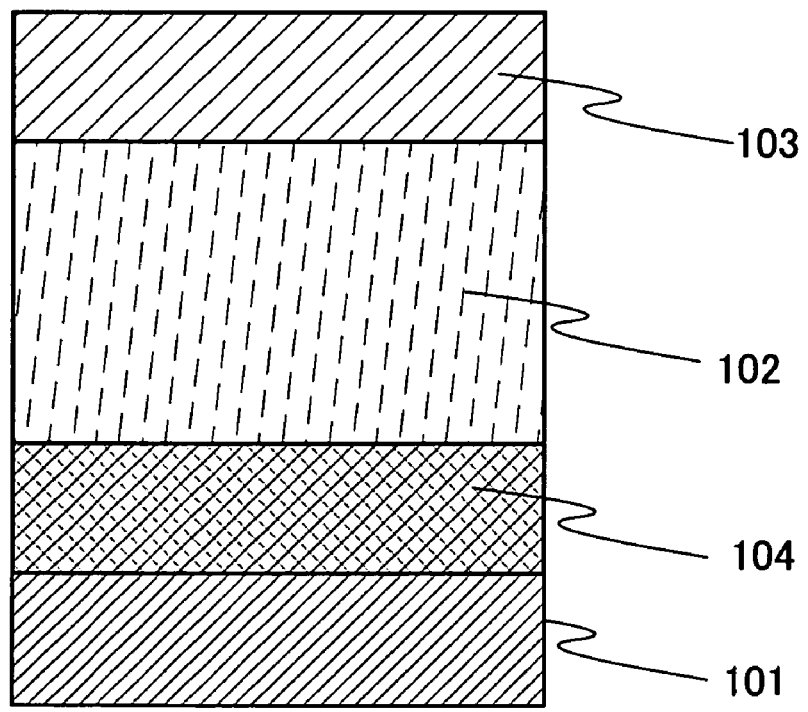
FIG. 2 is a diagram explaining a structure of a nonlinear element according to the present invention.

Further, a structure of a layer provided between the first electrode 101 and the second electrode 103 is not limited to the above described structure. FIG. 2 shows an example of an element structure including plural layers between a first electrode and a second electrode. In the element structure of FIG. 2, a first layer 102 including a composite material containing an organic compound and an inorganic compound and a second layer 104 including a composite material containing an organic compound and an inorganic compound whose mixing ratio between the organic compound and the inorganic compound is different from that of the layer 102, are provided between a first electrode 101 and a second electrode 103. By employing this structure, a film between the electrodes can be increased, making it possible to prevent short-circuiting due to impact and the like. Consequently, a highly reliable nonlinear element can be obtained.

Further, by using the composite material, the nonlinear element of the prevent invention can be driven at lower voltage as compared to a conventional nonlinear element using an insulating thin film.

Since resistance of the nonlinear element according to the present invention is less affected by variations in thickness of a composite material as compared to an insulating thin film which has been used in a conventional nonlinear element, variations in characteristics of the nonlinear element can be prevented.

Further, time required for a conventional nonlinear element to make an insulating thin film with a uniform thickness, can be eliminated in the nonlinear element of the present invention, and therefore, productivity can be improved.

Moreover, since resistance of the nonlinear element according to the present invention is less affected by variations in thickness of the composite material, and therefore, a thickness of the composite material can be increased as compared to an insulating thin film used in a conventional nonlinear element. Increasing the thickness of the composite material can prevent short-circuiting caused by impart and the like, and hence, a highly reliable nonlinear element can be obtained.

On the other hand, although a conventional nonlinear element has a limitation in reduction of thickness of an insulating thin film since the insulating thin film has a switching function, a thickness of the composite material included in the nonlinear element of the present invention can be more reduced as compared to the insulating thin film included in the conventional nonlinear element since resistance of the nonlinear element is less affected by variations in thickness of the composite material. Accordingly, a high integrated device can be accomplished by reducing the thickness of the nonlinear element. For example, the thickness of an insulating thin film used for the conventional nonlinear element is usually 20 nm or more and 100 nm or less. Meanwhile, the thickness of a film between electrodes of the nonlinear element using the composite material of the present invention, can be set to be 10 nm or more and 1,000 nm or less, and preferably, 10 nm or more and 500 nm or less.

That is, the thickness of the composite material used in the nonlinear element of the present invention, can be freely increased or reduced depending on the purpose.

Furthermore, since the nonlinear element of the present invention exhibits the same behavior in the both cases of applying forward bias voltage and reverse bias voltage thereto, and therefore, flicker and the like caused by a difference in transmittance when inverting voltage applied to a liquid crystal, can be prevented.

EMBODIMENT MODE 2

Figure 3A:
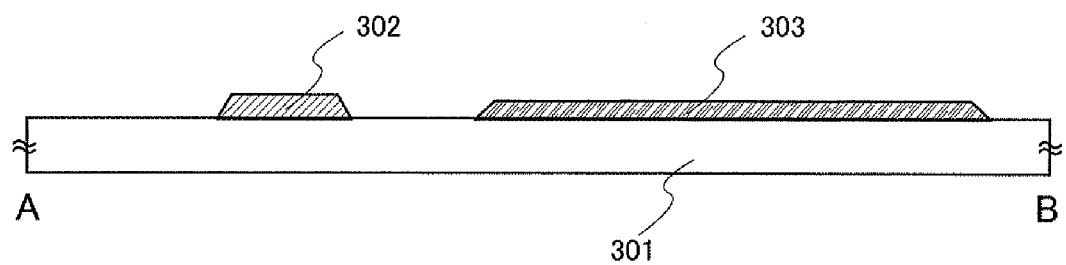
FIGS. 3A to 3C are cross sectional views explaining a method for manufacturing an element substrate including a nonlinear element according to the present invention.
Figure 3B:
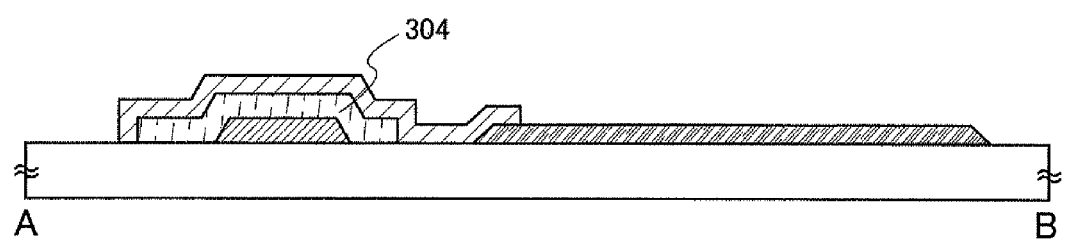
Figure 3C:
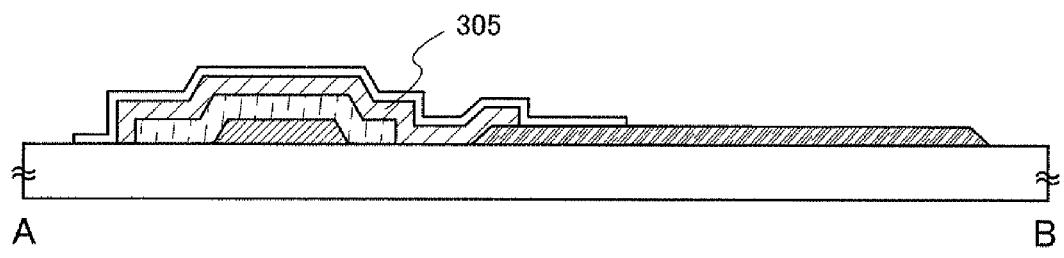
Figure 4A:
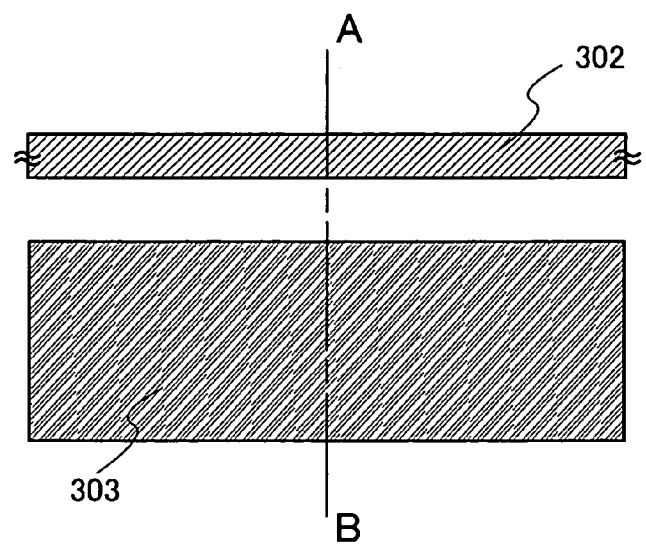
FIGS. 4A to 4C are top views explaining a method for manufacturing an element substrate including a nonlinear element according to the present invention.
Figure 4B:
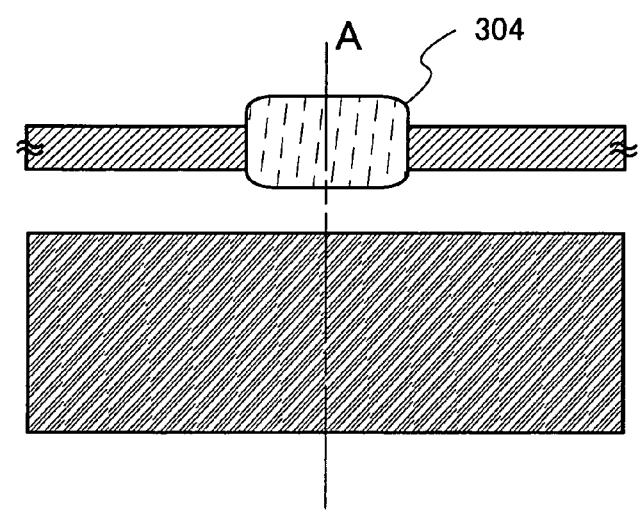
Figure 4C:
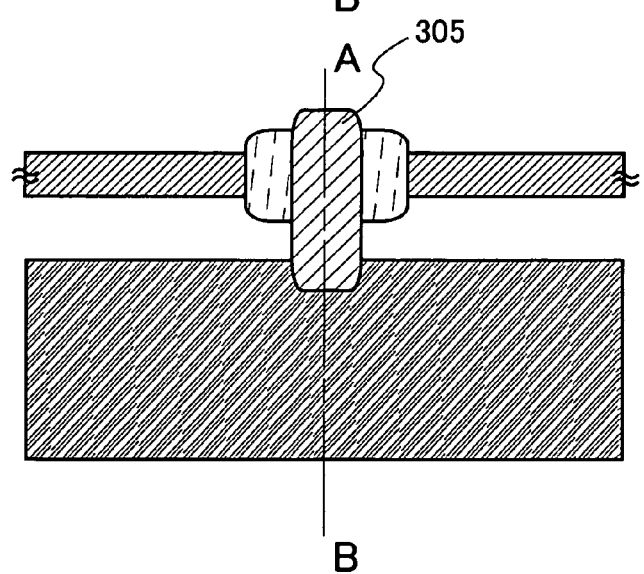

In Embodiment Mode 2, one mode of a structure of an element substrate including a nonlinear element of the present invention as described in Embodiment Mode 1, and a method for manufacturing thereof will be described. FIGS. 3A to 3C are cross sectional views along lines A-B of FIGS. 4A to 4C in respective steps, whereas FIGS. 4A to 4C are top views in the respective steps.

Over an insulating substrate 301, a first electrode 302 is formed to have a desired shape by using a technique for forming a pattern. The first electrode 302 may be formed using the materials mentioned in Embodiment Mode 1. Further, the method for forming the first electrode is not limited to the above method.

In this embodiment mode, an insulating substrate made from glass, plastic, quartz, or the like can be used. Further, a material of the element substrate including the nonlinear element of the present invention, is not limited to the above materials.

A predetermined pattern is formed over the insulating substrate 301 over which the first electrode 302 is formed. The predetermined pattern is baked to form a pixel electrode 303 with a desired shape so as not to overlap with the first electrode 302. Further, the pixel electrode 303 may be formed using a conductive material such as a transparent conductive film, for example, indium tin oxide, indium tin oxide containing silicon oxide, or the like (see FIG. 3A and FIG. 4A). Furthermore, the pixel electrode 303 may be formed by using other formation method.

An evaporation mask is formed over the insulating substrate 301, over which the first electrode 302 and the pixel electrode 303 are formed, and a layer 304 containing a composite material is formed by co-evaporation so as to cover a top surface and a side surface of the first electrode 302 while utilizing the evaporation mask (see FIG. 3B and FIG. 4B). As a method for carrying out the co-evaporation, a method in which an organic compound and an inorganic compound are both evaporated by resistance heating, and the like can be given.

Subsequently, a second electrode 305 is formed to cover a side surface and a top surface of the layer 304 containing the composite material, a top surface and a part of a side surface of the pixel electrode 303, and a part of a top surface of the insulating substrate 301 over which the layer 304 containing the composite material and the pixel electrode 303 are not provided. Thus, an element substrate including a nonlinear element of the present can be formed (see FIG. 3C and FIG. 4C).

Further, the second electrode may be formed by arbitrarily selecting a material from the materials given in Embodiment Mode 1.

EMBODIMENT MODE 3

Figure 5A:
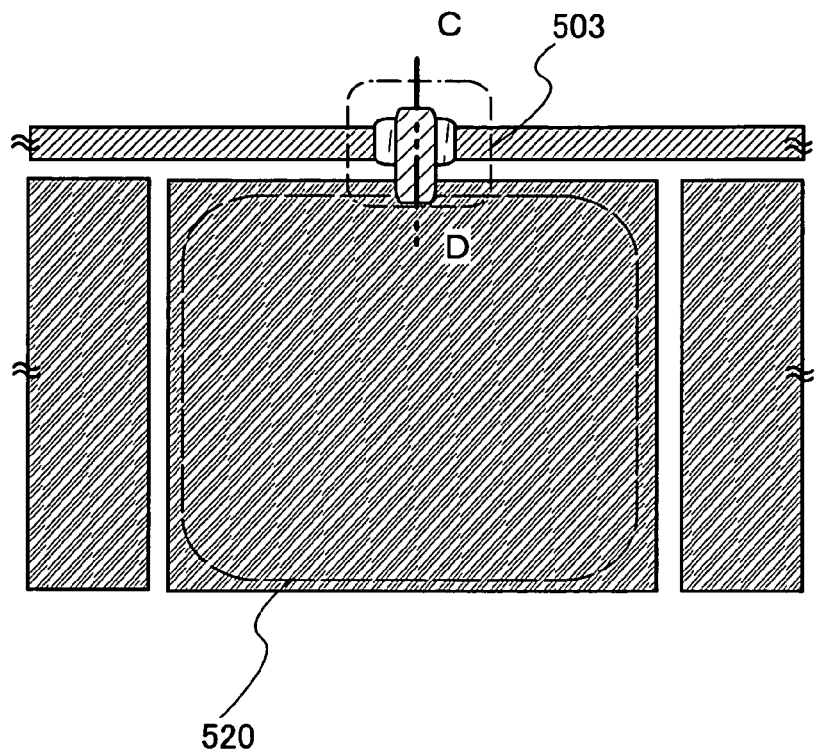
FIGS. 5A and 5B are diagrams explaining a method for manufacturing a liquid crystal display device including an element substrate, which has a nonlinear element according to the present invention.
Figure 5B:
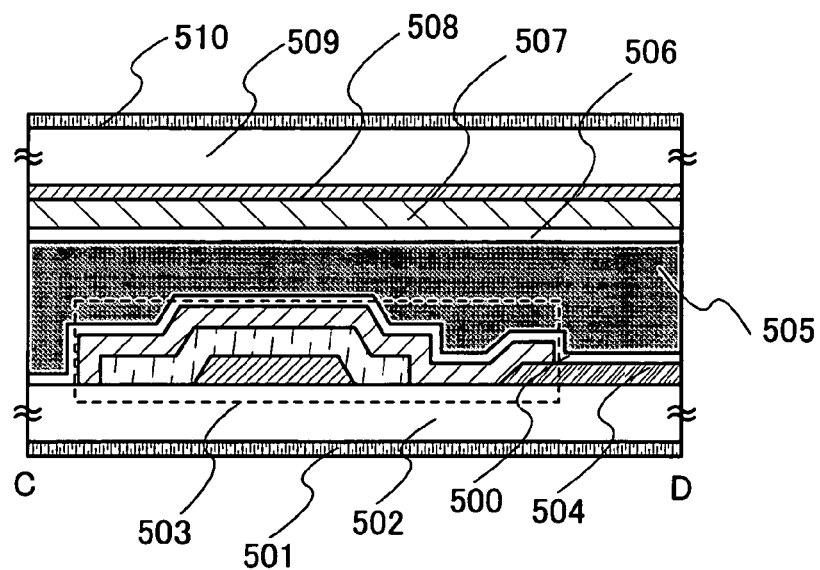

A liquid crystal display device can be manufactured by using a nonlinear element substrate of the present invention. In this embodiment mode, a method for manufacturing a liquid crystal display device will be described with reference to FIGS. 5A and 5B and FIGS. 6A to 6C. FIG. 5A is a top view showing a pixel region of a display device whereas FIG. 5B is a cross sectional view along a line C-D of FIG. 5A. FIG. 6A is also a top view of the display device and FIG. 6B is a cross sectional view along a line C-D of FIG. 6A. The same portions and portions having similar functions will not be explained repeatedly.

First, FIGS. 5A and 5B will be described. In the pixel region, a nonlinear element 503 of the present invention, and a pixel electrode 504 are provided over an insulating substrate 502 having a polarizing plate 501.

Next, an insulating layer 500, which is also referred to as an orientation film, is formed by printing or spin coating so as to cover a pixel electrode layer 520 and the nonlinear element 503. Further, the insulating layer 500 can be selectively formed by screen printing or offset printing. Thereafter, rubbing treatment is performed. Subsequently, a sealing material 604 is formed around the pixel region by a droplet discharging method (see FIGS. 6A and 6B).

Afterwards, a counter substrate 509 over which an insulating layer 506 serving as an orientation film, a colored layer 508 serving as a color filter, a conductive layer 507 serving as a counter electrode, and a polarizing plate 510 are provided, is attached to the insulating substrate 502 having the nonlinear element 503 through a spacer 602. A liquid crystal layer 505 is provided in an interspace between the insulating substrate 502 and the counter substrate 509. Thus, a liquid crystal display device can be manufactured (see FIGS. 6A and 6B). The sealing material 604 may contain filler. In addition, a light shielding film (a black matrix) and the like may be formed over the counter substrate 509. Further, the liquid crystal layer 505 can be formed by using a dispenser (a dropping method), a dipping method in which a liquid crystal is injected between the attached substrates by utilizing a capillary phenomenon, and the like.

The spacer may be provided by dispersing a particle with several μm. Alternatively, in the present embodiment mode, the spacer is provided by forming a resin film over an entire surface of the substrate and then adjusting the shape of the resin film. After applying a material for the space by a spinner, the material for the spacer is patterned into a predetermined shape through exposure treatment and developing treatment. In addition, the patterned material for the spacer is cured by heating at 150 to 200° C. using a clean oven or the like. The shape of the spacer manufactured in this manner can be changed depending on a condition of the exposure treatment and the developing treatment. Preferably, the spacer is formed to have a columnar shape with a planarized top surface so that mechanical strength suitable as a liquid crystal display device can be assured when attaching the counter substrate to the insulating substrate. The spacer may be formed to have a cone shape, a pyramid shape, or the like, and the shape of the spacer is not particularly limited.

A connection portion is formed to connect an internal portion of the liquid crystal display device manufactured in the above described steps to an external wiring substrate. Under atmospheric pressure or almost atmospheric pressure, the insulating layer in the connection portion is removed by ashing treatment using oxygen gas. This ashing treatment is performed by using oxygen gas and one or more elements selected from hydrogen, $CF_4$, $NF_3$, $H_2O$, and $CHF_3$. In this step, in order to prevent damage or destruction due to static electricity, the ashing treatment is performed after sealing the insulating substrate with the counter substrate. However, when the insulating substrate is less adversely affected by static electricity, the ashing treatment may be performed at any timing.

Subsequently, a wiring 603, which is electrically connected to the pixel portion, is connected to an FPC 605, which is a connection wiring substrate, through a conductive layer 608 (see FIG. 6B). The FPC 605 has an IC driver 614 and a function of transmitting a signal and potential from an external portion. The FPC 605 is electrically connected to an external circuit 612 (see FIG. 6A). Through the above described steps, a liquid crystal display device using the nonlinear element substrate of the present invention can be manufactured.

FIG. 6A shows a top view of the liquid crystal display device. As shown in FIG. 6A, a pixel region 610 is sealed between a substrate 620 and a counter substrate 611 with the sealing material 604, and a nonlinear element for controlling switching of a pixel is provided over the substrate 620.

Figure 6C:
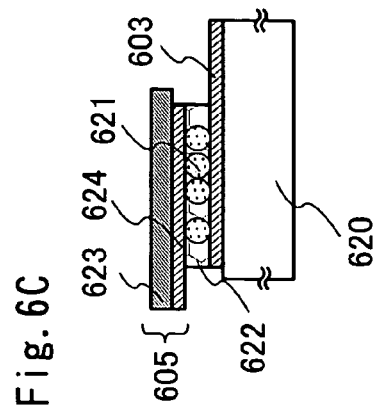
FIG. 6A is a top view and FIGS. 6B and 6C are cross sectional views explaining a liquid crystal display device including an element substrate, which has a nonlinear element according to the present invention.
Figure 6A:
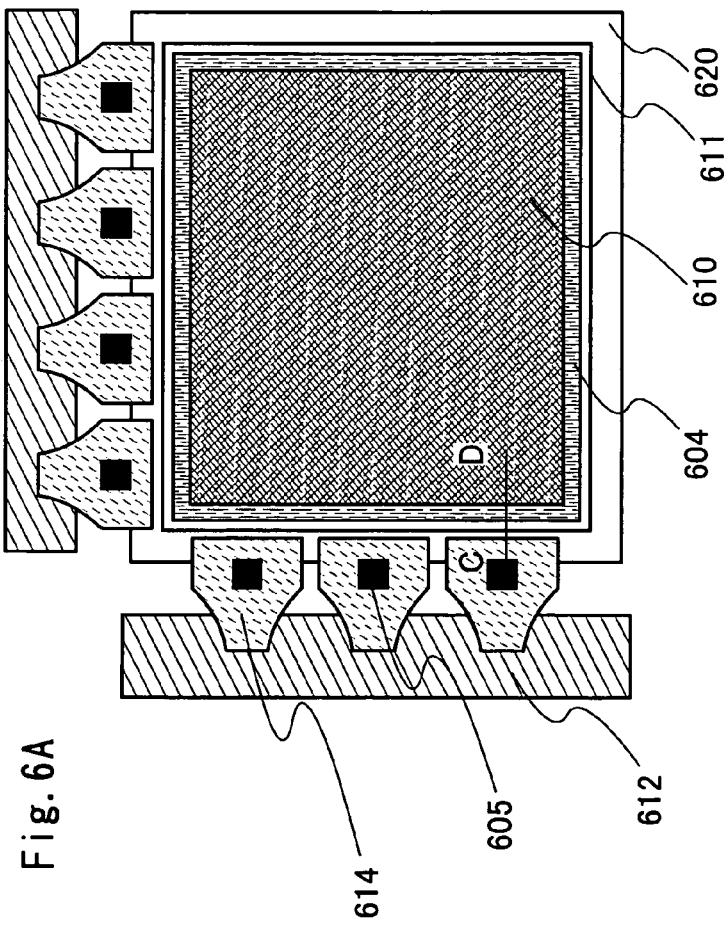
Figure 6B:
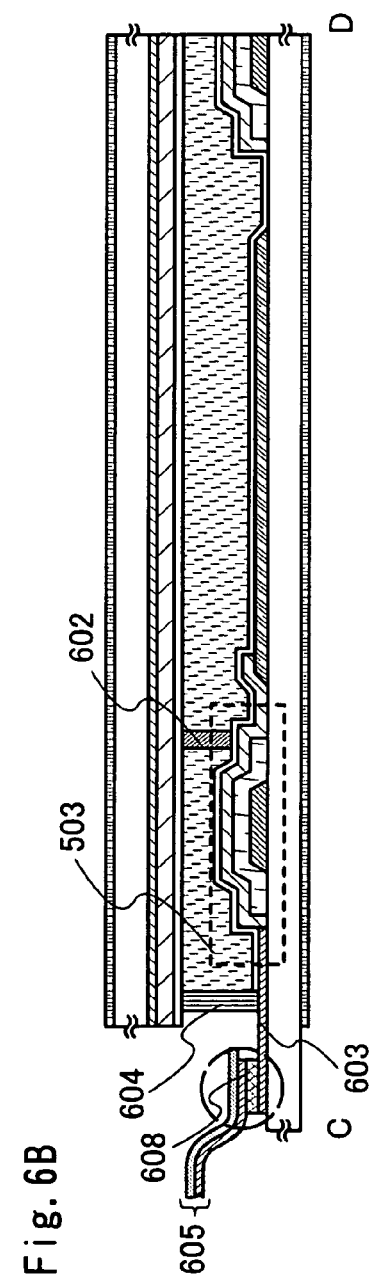

FIG. 6C shows an enlarged view of a portion where the FPC 605 and the wiring 603 are connected. As shown in FIG. 6C, the wiring 603 provided over the substrate 620 and the FPC 605 including a metal wiring 624 and a film 623 are attached to each other with an adhesive agent 622 containing conductive beads 621. Further, the wiring may be formed using the above mentioned metal or alloy. The conductive beads are formed using conductive fine particles such as silver particles, copper particles, and gold particles. As the adhesive agent, a heat curing resin, an ultraviolet curing resin, or the like may be used. Note that materials other than the above mentioned materials can arbitrarily be used. Further, the wiring 603 formed over the substrate 620 and the FPC may be electrically connected to each other by using a conductive adhesive agent such as a silver paste, a copper paste, and a carbon paste or by a method by which soldering bond is performed, as a substitute for the adhesive agent containing the conductive beads.

Through the above described steps, it is possible to manufacture a liquid crystal display Device using a nonlinear element of the present invention, which can be driven at low voltage.

EMBODIMENT MODE 4

In accordance with the present invention, various kinds of display devices can be realized.

As various kinds of electronic appliances, for example, a camera such as a video camera and a digital camera; a projector; a head mounted display (a goggle type display); a car navigation system; a car stereo; a personal computer; a game machine; a portable information terminal (such as a mobile computer, a mobile phone, and an electronic book); an image reproduction device equipped with a recording medium (concretely, a device which can reproduce a recording medium such as a digital versatile disk (DVD) and is equipped with a display device capable of displaying the image); and the like can be given. Specific examples of these electronic appliances are shown in FIGS. 7A to 7D.

Figure 7A:
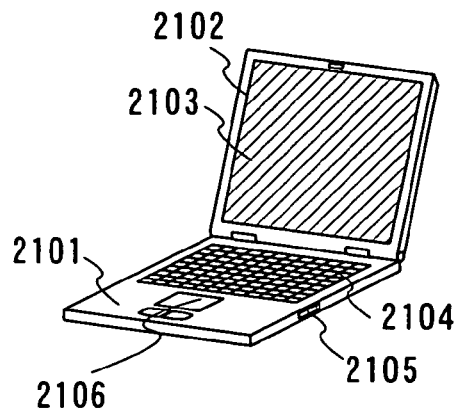
FIGS. 7A to 7D are diagrams explaining examples of electronic appliances.

FIG. 7A shows a personal computer including a main body 2101, a housing 2102, a display portion 2103, a keyboard 2104, an external connection port 2105, a pointing mouse 2106, and the like. In accordance with the present invention, the display portion 2103 can be formed. Utilizing the present invention makes it possible to drive the personal computer at lower voltage.

Figure 7B:
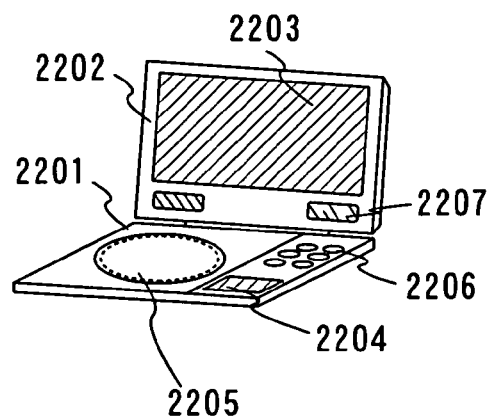

FIG. 7B shows an image reproduction device equipped with a recording medium (concretely, a DVD reproduction device), including a main body 2201, a housing 2202, a display portion A 2203, a display portion B 2204, a recording medium (DVD or the like) reading portion 2205, operation keys 2206, a speaker portion 2207, and the like. The display portion A 2203 mainly displays image information while the display portion B 2204 mainly displays character information. In accordance with the present invention, the display portion A 2203 and the display portion B 2204 can be formed. By utilizing the present invention, a highly-reliable fine image can be displayed at lower voltage even though the image reproduction device is miniaturized and a wiring and the like are precisely formed.

Figure 7C:
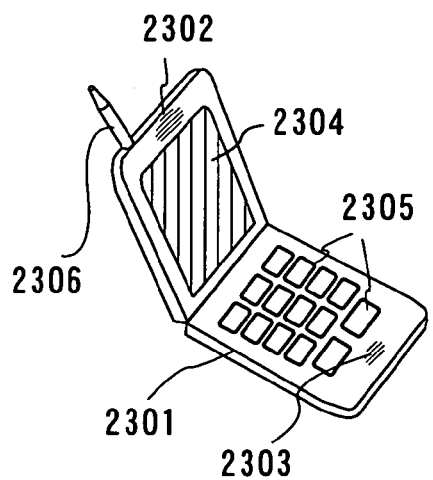

FIG. 7C shows a portable phone including a main body 2301, an audio output portion 2302, an audio input portion 2303, a display portion 2304, operation switches 2305, an antenna 2306, and the like. By applying a display device manufactured in accordance with the present invention to the display portion 2304, a highly-reliable fine image can be displayed at lower voltage even though the portable phone is miniaturized and a wiring and the like are precisely formed.

Figure 7D:
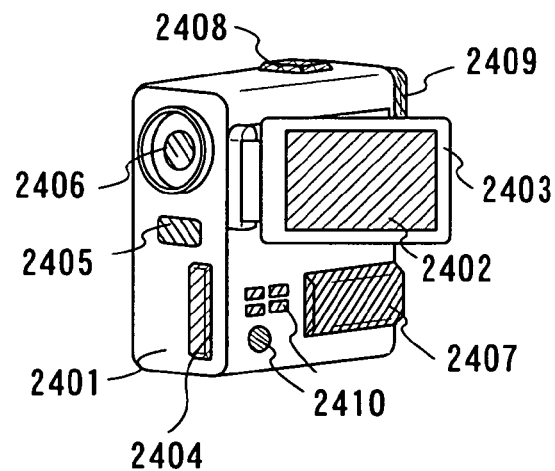

FIG. 7D shows a video camera, including a main body 2401, a display portion 2402, a housing 2403, an external connection port 2404, a remote control receiving portion 2405, an image receiving portion 2406, a buttery 2407, an audio input portion 2408, operation keys 2409, and the like. The display portion 2402 can be formed in accordance with the present invention. By applying a display device manufactured according to the present invention to the display portion 2404, a high-reliable fine image can be displayed at lower voltage even though the video camera is miniaturized and a wiring and the like are precisely formed. This embodiment mode can be freely combined with the above embodiment modes.

As set forth above, an application range of a display device having an element substrate which includes a nonlinear element of the present invention is extremely wide, and this display device can be applied to electronic appliances in various fields.

EMBODIMENT 1

In Embodiment 1, voltage-current characteristics of a film formed using a composite material containing an organic compound and an inorganic compound, will be explained. First, a glass substrate was prepared and an electrode with an area of 4 $mm^2$ was formed thereover using indium tin oxide containing silicon oxide to have a thickness of 110 nm.

Next, the glass substrate over which indium tin oxide containing silicon oxide was formed, was washed with water and then dried. Thereafter, the glass substrate was fixed to a substrate holder inside of a vacuum evaporation apparatus such that a surface of the indium tin oxide containing silicon oxide faced downward. Then, 4,4'-bis(N-{4-[N,N-bis(3-methylphenyl)amino]phenyl}-N-phenylamino) biphenyl (abbreviation: DNTPD), molybdenum oxide (VI), and rubrene were separately put in different resistance-heating-type evaporation sources. Under a vacuum condition where pressure is reduced to $1 \times 10^{-3}$ Pa or less, a composite film was formed by co-evaporation using a composite material containing DNTPD, molybdenum oxide, and rubrene. In this case, DNTPD, molybdenum oxide, and rubrene were evaporated at a rate of 0.2 nm/s such that a mass ratio between DNTPD, molybdenum oxide, and rubrene was adjusted to be 1:0.1:0.02 (DNTPD:molybdenum oxide:rubrene). The thickness of the composite film including DNTPD, molybdenum oxide, and rubrene was set to be 200 nm to be the same as the thickness of a film only containing DNTPD of Comparative Example 1 below. Also, another electrode was formed using aluminum (Al) thereover to have a thickness of 200 nm. Note that rubrene was added as a stabilizer for a film quality.

Figure 10:
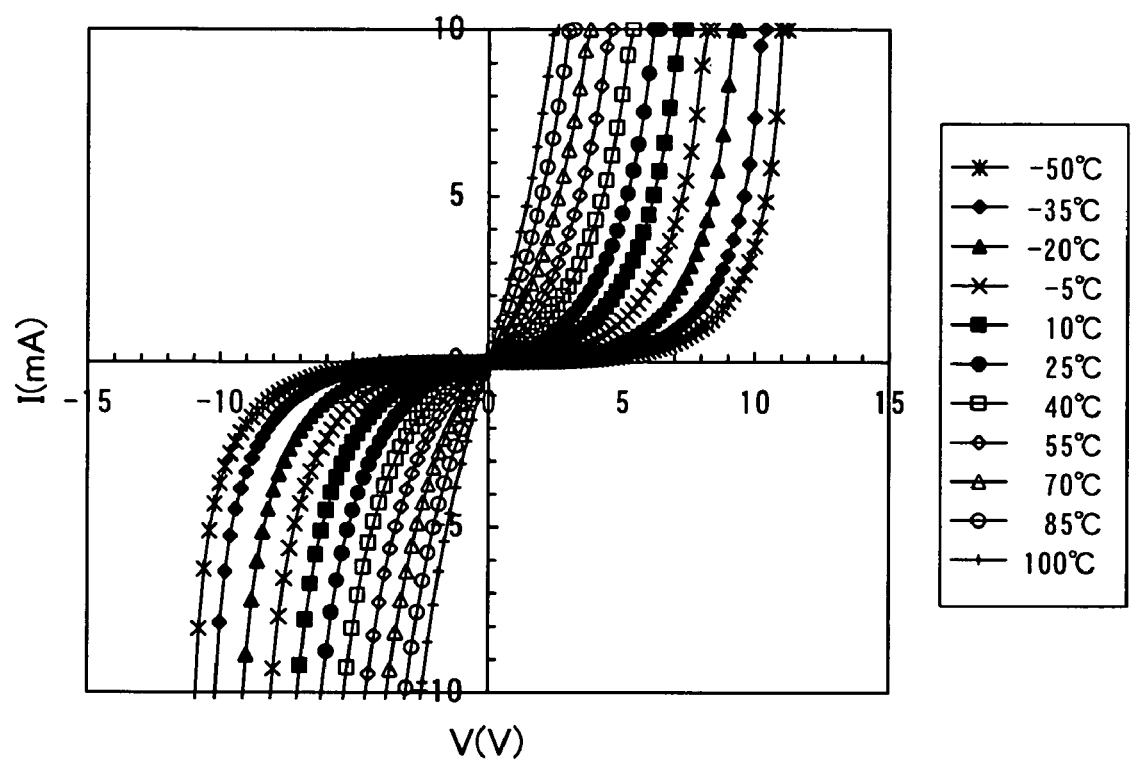
FIG. 10 is a graph showing voltage-current characteristics of an element using a composite material containing an organic compound and an inorganic compound of the present invention.

FIG. 10 shows measurement results of voltage-current characteristics of the thus obtained structure formed by stacking the electrode made from indium tin oxide containing silicon oxide, the composite film containing DNTPD, molybdenum oxide, and rubrene, and the electrode made from Al in this order, in the cases of −50° C., −35° C., −20° C., −5° C., 10° C., 25° C., 40° C., 55° C., 70° C., 85° C., and 100° C. Note that, in this embodiment, a case where potential of the electrode made from indium tin oxide containing silicon oxide is higher than that of the electrode made from Al, is set to be a forward bias.

Since almost the same amount of current flowed in the both cases of forward bias and reverse bias, an equal amount of holes was injected from both of the electrode made from indium tin oxide containing silicon oxide and the electrode made from Al.

Next, voltage-current characteristics of a composite material having a different mass ratio between DNTPD, molybdenum oxide, and rubrene from that of the above described composite material, will be described. First, a glass substrate was prepared and an electrode with an area of 4 mm$^2$ was formed thereover using indium tin oxide containing silicon oxide to have a thickness of 110 nm.

Next, the glass substrate over which indium tin oxide containing silicon oxide was formed, was washed with water and then dried. Thereafter, the glass substrate was fixed to a substrate holder inside of a vacuum evaporation apparatus such that a surface of the indium tin oxide containing silicon oxide faced downward. Then, DNTPD, molybdenum oxide (VI), and rubrene were separately put in different resistance-heating-type evaporation sources. Under a vacuum condition where pressure is reduced to 1×10$^{-3}$ Pa or less, a composite film was formed by co-evaporation using a composite material containing DNTPD, molybdenum oxide, and rubrene. In this case, DNTPD, molybdenum oxide, and rubrene were evaporated at a rate of 0.2 nm/s such that a mass ratio between DNTPD, molybdenum oxide, and rubrene was set to be 1:0.75:0.02 (DNTPD:molybdenum oxide:rubrene). The thickness of the composite film including the composite material containing DNTPD, molybdenum oxide, and rubrene was set to be 200 nm to be the same as the thickness of a film only containing DNTPD of Comparative Example 1 below. Also, another electrode was formed using aluminum (Al) thereover to have a thickness of 200 nm. Further, rubrene was added as a stabilizer for a film quality, and therefore, it is not necessarily required.

Figure 11:
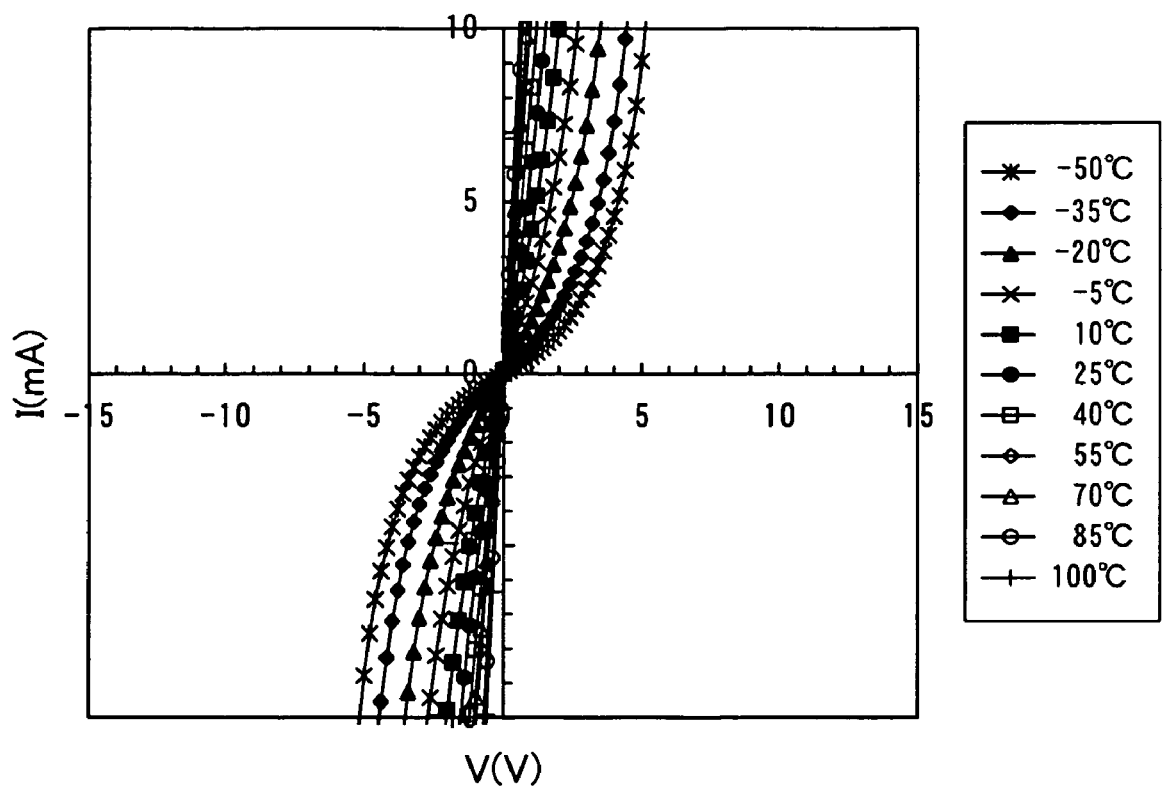
FIG. 11 is a graph showing voltage-current characteristics of an element using a composite material containing an organic compound and an inorganic compound of the present invention.

FIG. 11 shows measurement results of voltage-current characteristics of the thus obtained structure formed by stacking the electrode made from indium tin oxide containing silicon oxide, the composite film containing DNTPD, molybdenum oxide, and rubrene, and the electrode made from Al in this order over the substrate, in the cases of −50° C., −35° C., −20° C., −5° C., 10° C., 25° C., 40° C., 55° C., 70° C., 85° C., and 100° C.

Since almost the same amount of current flowed in the both cases of forward bias and reverse bias, an equal amount of holes was injected from both of the electrode made from indium tin oxide containing silicon oxide and the electrode made from Al. Further, larger amount of current flowed through the above manufactured structure including the composite material at lower driving voltage, than a sample including a composite material in which the mass ratio between DNTPD, molybdenum oxide, and rubrene was set to be 1:0.1:0.02.

Next, voltage-current characteristics of a sample of a film only containing DNTPD, and voltage-current characteristics of a sample of a film only containing molybdenum oxide (VI) will be described to be compared with the voltage-current characteristics of the above manufactured structures each containing the composite film of DNTPD, molybdenum oxide, and rubrene.

COMPARATIVE EXAMPLE 1

First, voltage-current characteristics of a sample of a film only containing DNTPD, will be described. First, a glass substrate was prepared and an electrode with an area of 4 mm$^2$ was formed thereover using indium tin oxide containing silicon oxide to have a thickness of 110 nm.

Next, the glass substrate over which indium tin oxide containing silicon oxide was formed, was washed with water and then dried. Thereafter, the glass substrate was fixed to a substrate holder inside of a vacuum evaporation apparatus such that a surface of the indium tin oxide containing silicon oxide faced downward. Then, DNTPD was put in a resistance-heating-type evaporation source. Under a vacuum condition where pressure is reduced to 1×10$^{-3}$ Pa or less, a film was formed using DNTPD by vacuum evaporation. The thickness of the layer only containing DNTPD was set to be 200 nm. Also, another electrode was formed using aluminum (Al) thereover to have a thickness of 200 nm.

Figure 8:
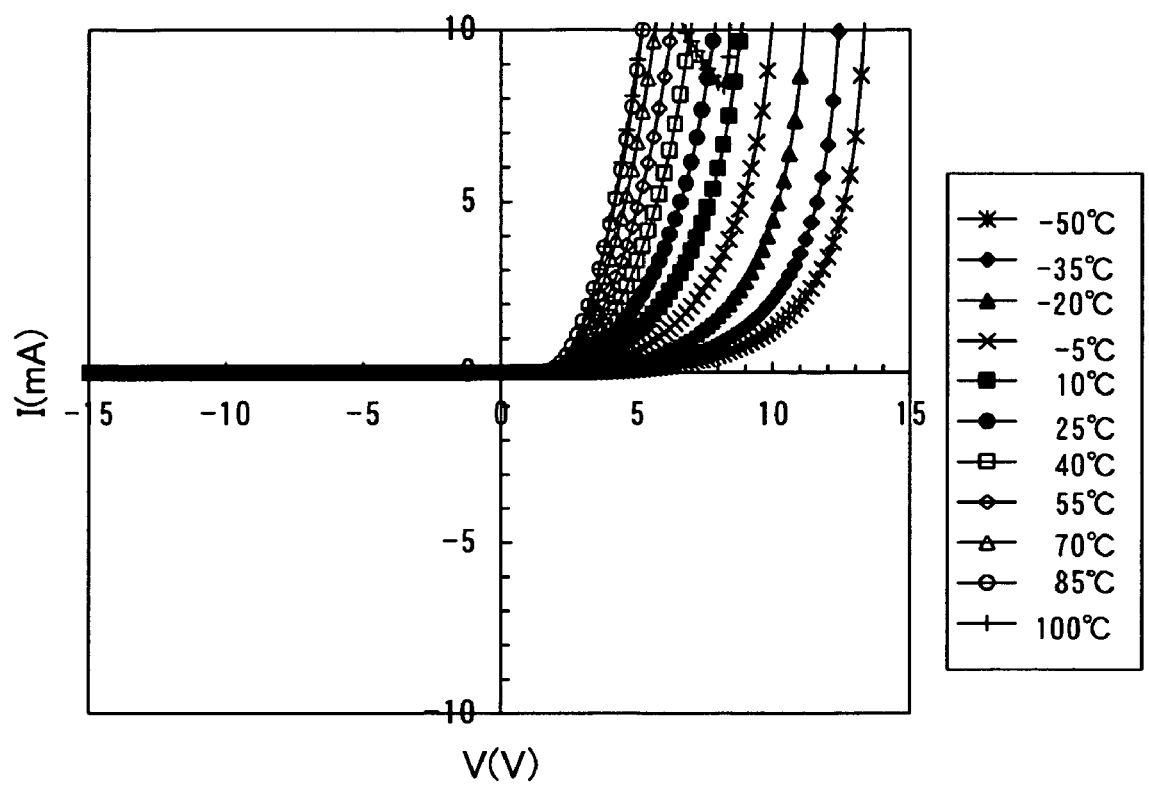
FIG. 8 is a graph showing voltage-current characteristics of an element using a DNTPD film.

FIG. 8 shows measurement results of voltage-current characteristics of the thus obtained structure formed by stacking the electrode made from indium tin oxide containing silicon oxide, the film only containing DNTPD, and the electrode made from Al in this order, in the cases of −50° C., −35° C., −20° C., −5° C., 10° C., 25° C., 40° C., 55° C., 70° C., 85° C., and 100° C.

As shown in FIG. 8, current flowed in the case of forward bias, and therefore, holes were injected from the electrode made from indium tin oxide containing silicon oxide. On the other hand, current did not flow in the case of reverse bias and the sample showed a rectifying property. Therefore, this indicated that holes were not injected from the electrode made from Al.

COMPARATIVE EXAMPLE 2

Next, voltage-current characteristics of a film only containing molybdenum oxide (VI) will be described. First, a glass substrate was prepared and an electrode with an area of 4 mm$^2$ was formed thereover using indium tin oxide containing silicon oxide to have a thickness of 110 nm.

Subsequently, the glass substrate over which indium tin oxide containing silicon oxide was formed, was washed with water and then dried. Thereafter, the glass substrate was fixed to a substrate holder inside of a vacuum evaporation apparatus such that a surface of the indium tin oxide containing silicon oxide faced downward. Then, molybdenum oxide (VI) was put in a resistance-heating-type evaporation source. Under a vacuum condition where pressure is reduced to 1×10$^{-3}$ Pa or less, a film was formed using molybdenum oxide (VI) by vacuum evaporation. The thickness of the layer only containing molybdenum oxide was set to be 75 nm. Also, another electrode was formed using aluminum thereover to have a thickness of 200 nm.

Figure 9:
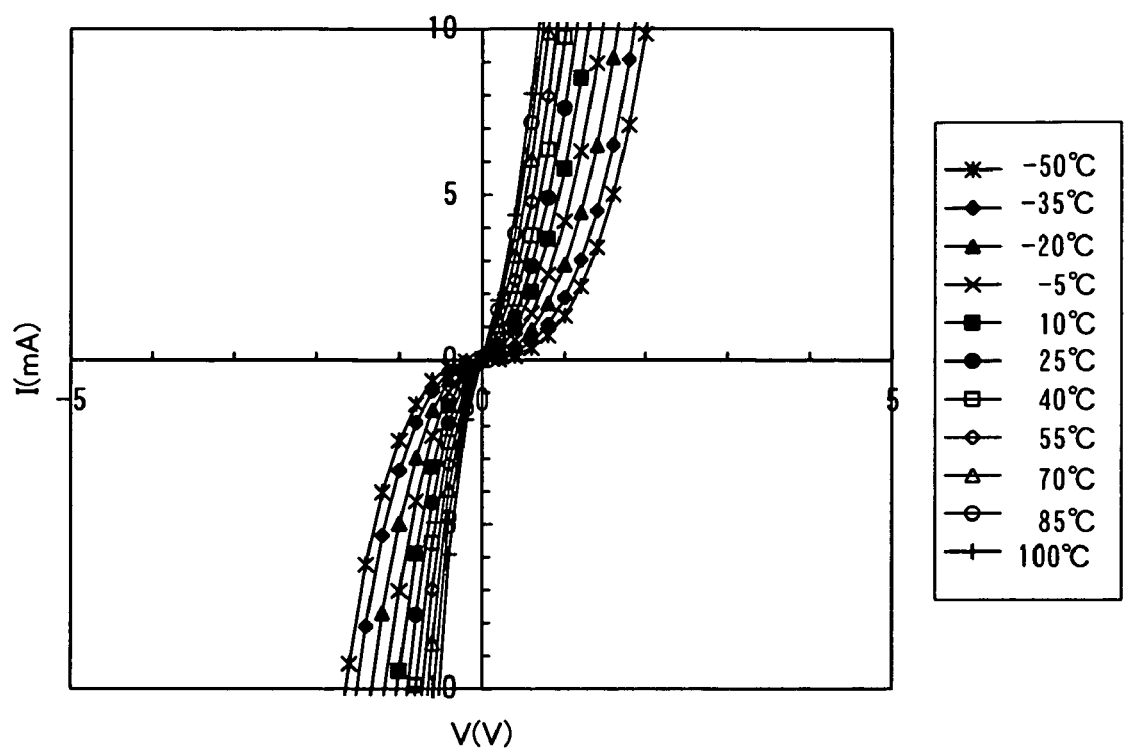
FIG. 9 is a graph showing voltage-current characteristics of an element using a molybdenum oxide (VI) film.

FIG. 9 shows measurement results of voltage-current characteristics of the thus obtained structure formed by stacking the electrode made from indium tin oxide containing silicon oxide, the film only containing molybdenum oxide (VI), and the electrode made from Al in this order, in the cases of −50° C., −35° C., −20° C., −5° C., 10° C., 25° C., 40° C., 55° C., 70° C., 85° C., and 100° C.

FIG. 9 shows voltage-current characteristics of the film only containing molybdenum oxide manufactured in Comparative Example 2. As shown in FIG. 9, in Comparative Example 2, current flowed in the both cases of forward bias and reverse bias differing from the voltage-current characteristics of the film only containing DNTPD described in Comparative Example 1, and therefore, holes are injected from both the electrode made from indium tin oxide containing silicon oxide and the electrode made from Al. Further, as compared to Comparative Example 1 described above, a larger amount of current flowed through the film only containing molybdenum oxide of Comparative Example 2 at lower voltage.

Furthermore, almost the same amount of current flowed through the composite film including a composite material of the present invention described above in the both cases of forward bias and reverse bias (FIG. 10 and FIG. 11). On the other hand, in Comparative Example 2, the amount of current flowed through the film only containing molybdenum oxide described in the case of forward bias was different from the amount of current flowed therethrough in the case of reverse bias (FIG. 9).

Accordingly, it is thought that although current flowed through the film only containing molybdenum oxide in the both cases of forward bias and reverse bias, since a barrier existed in an interface of one of the forward bias and the reverse bias, the amount of current flowing therethrough in the case of the forward bias was different from the amount of current flowing therethrough in the case of the reverse bias.

The preferable characteristics were obtained in the organic compound having a hole transporting property included in the composite film from the above measurement results, and therefore, it is thought that carriers in the composite film are holes.

Further, the voltage-current characteristics of the composite film show a tendency in which current was difficult to be fed at lower temperature. From the viewpoint of a transporting property of the composite film, it is thought that this is because carrier density is reduced at lower temperature.

Figure 15A:
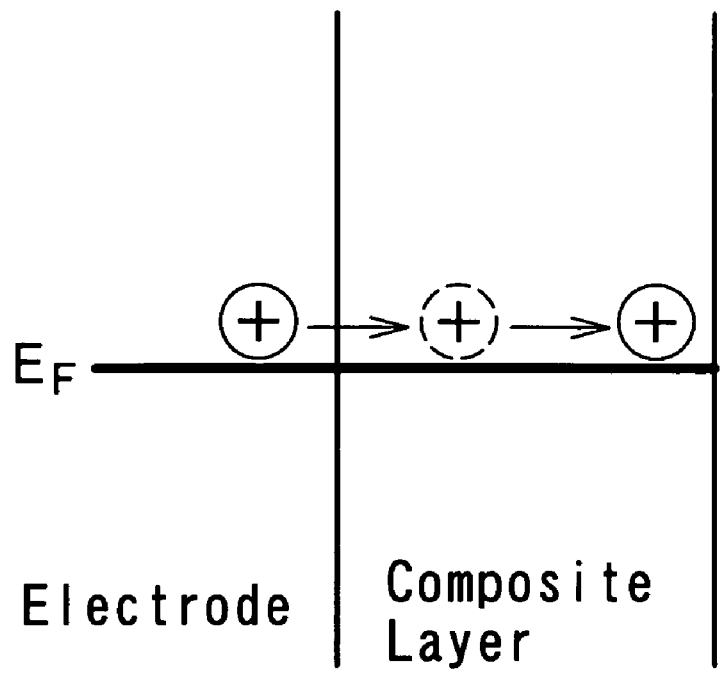
FIGS. 15A and 15B are diagrams explaining an energy barrier.

Meanwhile, a mechanism focused on carrier injection can be thought. The voltage-current characteristics of the composite film have a symmetry property in which an absolute value of the amount of current in the case of the forward bias corresponds to an absolute value of the amount of current in the case of the reverse bias. Although the current was difficult to be fed at lower temperature, this symmetry property was maintained. If there is a rate-determining process like a Schottky barrier as shown in FIG. 15A in the carrier injection caused by a junction barrier with an interface, there is electrode dependence. However, the voltage-current characteristics of the structure including the composite film has a symmetry property though the structure includes the electrode made from indium tin oxide containing silicon oxide and the electrode made from Al. Accordingly, it is thought since carrier injection is not rate-determined at the barrier of the interface, current is difficult to be fed at lower temperature.

Figure 15B:
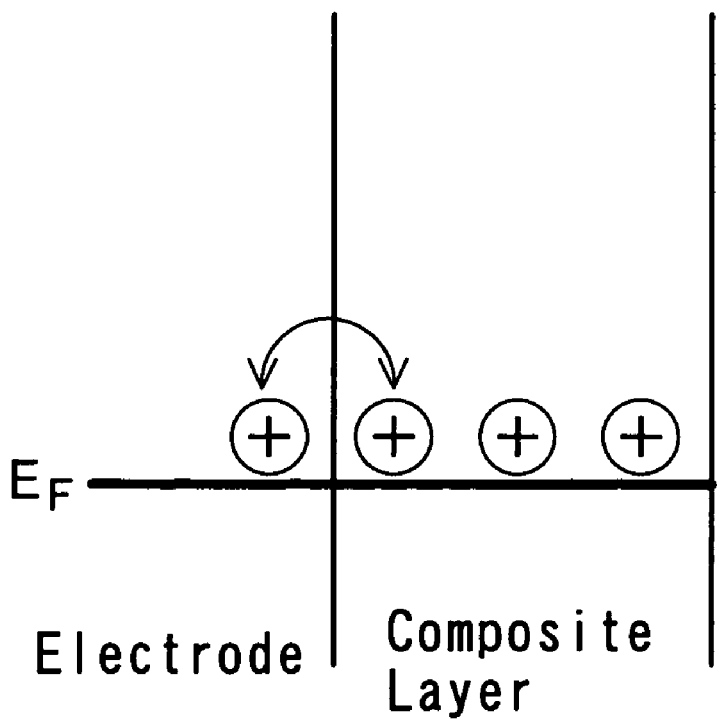

Next, as shown in FIG. 15B, it is thought that the carrier injection is rate-controlled by carrier mobility of the composite film. This is caused by stop of carrier injection from an electrode due to coulomb repulsion, which is caused by gathering of carriers at an interface between an electrode and the composite film. In this case, when the electrode and the composite film make ohmic contact to each other, there is no electrode dependence.

As described above, it is thought that an interface between the electrode and the composite material makes ohmic contact, and the difficulty in feeding current at lower temperature is caused by reduction in carrier density and carrier mobility. Further, the interface therebetween makes the ohmic contact even at lower temperature, and therefore, the absolute value of the amount of current in the case of the forward bias and the absolute value of the amount of current in the case of reverse bias correspond to each other and have a symmetry property. Furthermore, it is thought that since carrier injection is hindered by reduction in carrier mobility, the current in a low voltage region at lower temperature is not in proportion to a primary line of voltage and does not be ohmic current.

EMBODIMENT 2

In this embodiment, the composite material shown in Embodiment 1, will be described in more detail.

A glass substrate was prepared and an electrode with an area of 4 mm² was formed thereover using indium tin oxide containing silicon oxide to have a thickness of 110 nm. The glass substrate having the electrode made from indium tin oxide containing silicon oxide was washed with water and then dried. Thereafter, the glass substrate was set in an evaporation apparatus, and a vacuum chamber is evacuated such that pressure is reduced to $1 \times 10^{-3}$ Pa or less.

Next, a film was formed by co-evaporation of DNTPD, which is an organic compound, molybdenum oxide (VI), which is an inorganic compound, and rubrene. Here, co-evaporation was controlled such that a mass ratio between DNTPD, molybdenum oxide, and rubrene, and a thickness of the film containing the composite material satisfied each level of Table 1. Note that rubrene was added as a stabilizer for a film quality.

TABLE 1

| Element | Mass ratio | | | Thickness |
| --- | --- | --- | --- | --- |
|  | DNTPD | MoOx | rubrene | (µm) |
| 1 | 1 | 0 | 0 | 200 |
| 2 | 1 | 0.05 | 0.02 | 200 |
| 3 | 1 | 0.1 | 0.02 | 200 |
| 4 | 1 | 0.5 | 0.02 | 200 |
| 5 | 1 | 0.75 | 0.02 | 200 |
| 6 | 0 | 0.75 | 0 | 0 |

Thereafter, an electrode was formed using Al to have a thickness of 200 nm. Through the above described steps, elements 1 to 6 were obtained.

Figure 12:
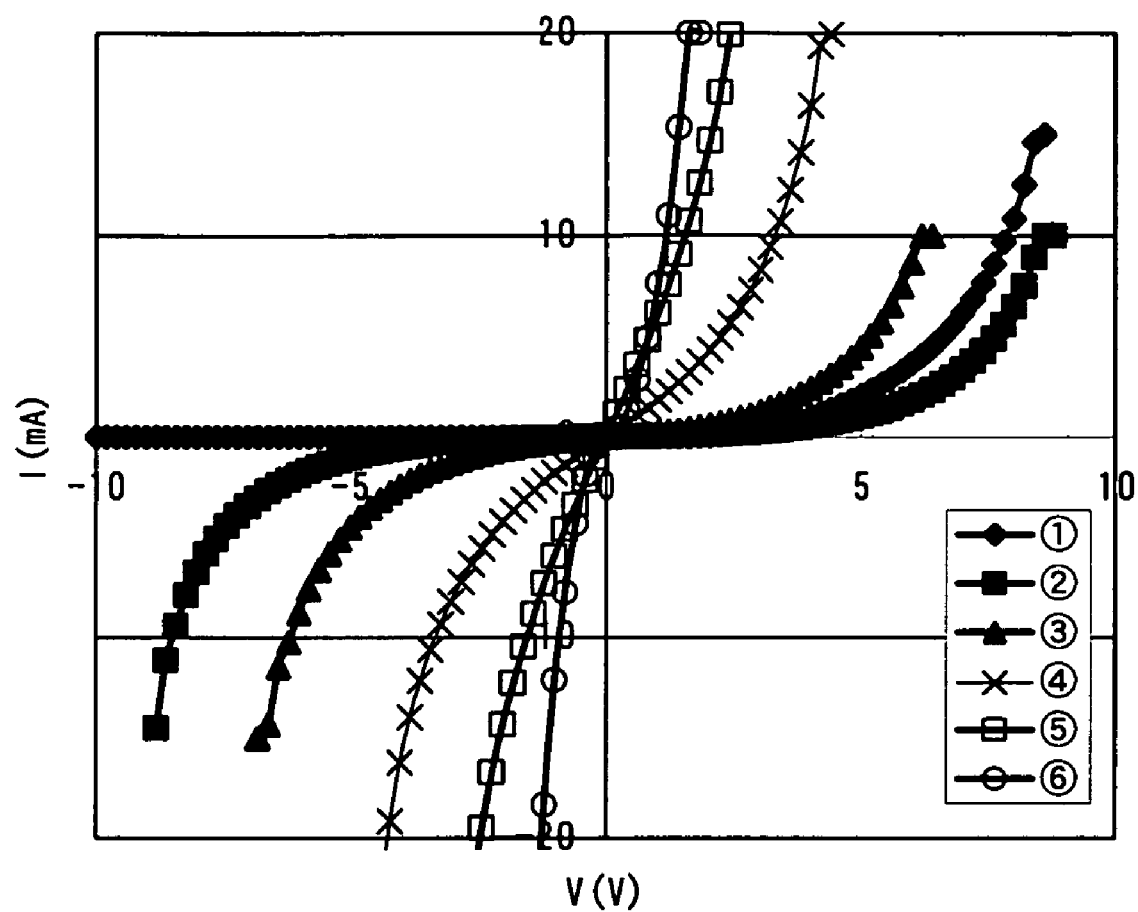
FIG. 12 is a graph showing voltage-current characteristics of elements at the temperature of 25° C.

Voltage-current characteristics of the elements 1 to 6 at the temperature of 25° C. are shown in FIG. 12. It is known that as the mass ratio of molybdenum oxide increased, the resistance of the elements 2 to 6 containing molybdenum oxide was reduced. Further, in the element 1 which did not contain molybdenum oxide, current did not flow in the case of reverse bias and the element 1 showed a rectifying property. This indicates that holes were not injected from the electrode made from Al. Furthermore, in the present embodiment, a case where potential of the electrode made from indium tin oxide containing silicon oxide is higher than that of the electrode made from Al, is set as forward bias.

Next, voltage-current characteristics of the elements 2 to 6 were measured in the cases of −50° C., −35° C., −20° C., −5° C., 10° C., 25° C., 40° C., 55° C., 70° C., 85° C., and 100° C. Further, when it is assumed that ohmic current flows through the elements 2 to 6 and the elements 2 to 6 are semiconductors since resistance of these elements are increased with a decrease in the temperature, this can be expressed by the following Arrhenius equation (equation 1):

$$R = V/I = A \times \exp(Ea/kT) \quad \text{[Equation 1]}$$

R: resistance
V: voltage
I: current
A: constant
Ea: activation energy
k: Boltzmann constant
T: absolute temperature Equation 1 reads to the following equation in the case of certain constant voltage.

$$\ln(I) = -(Ea/k) \times (1/T) + B \quad \text{[Equation 2]}$$

Figure 13:
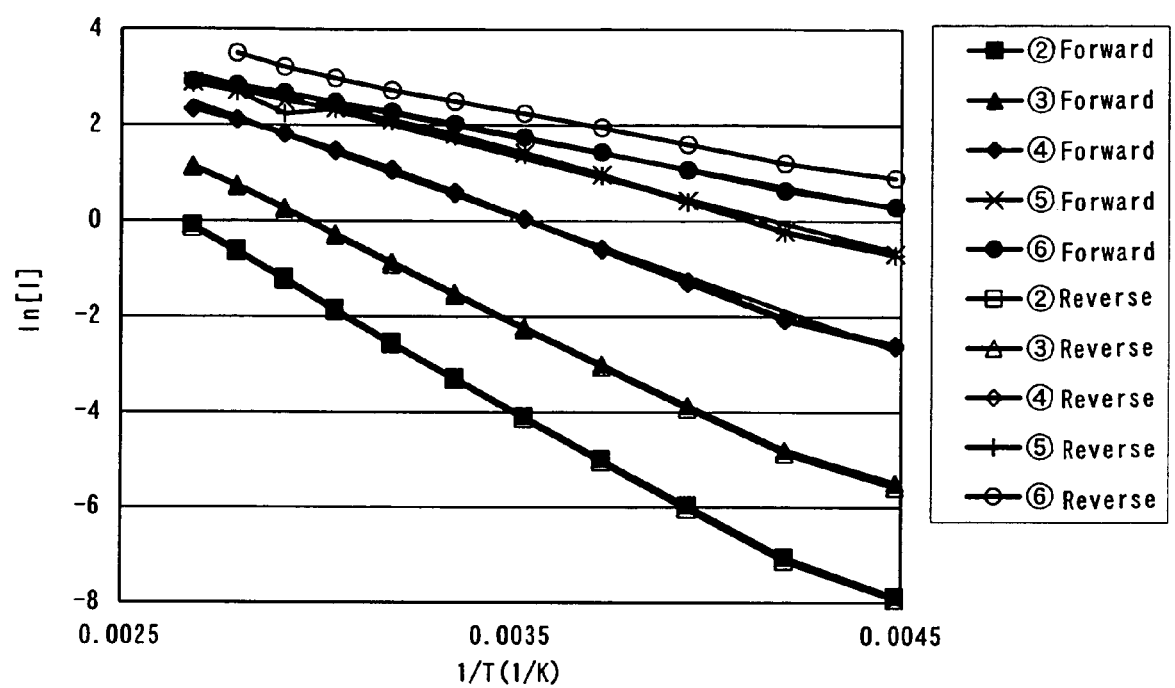
FIG. 13 is a graph showing Arrhenius plots of an element at 1V.
Figure 14:
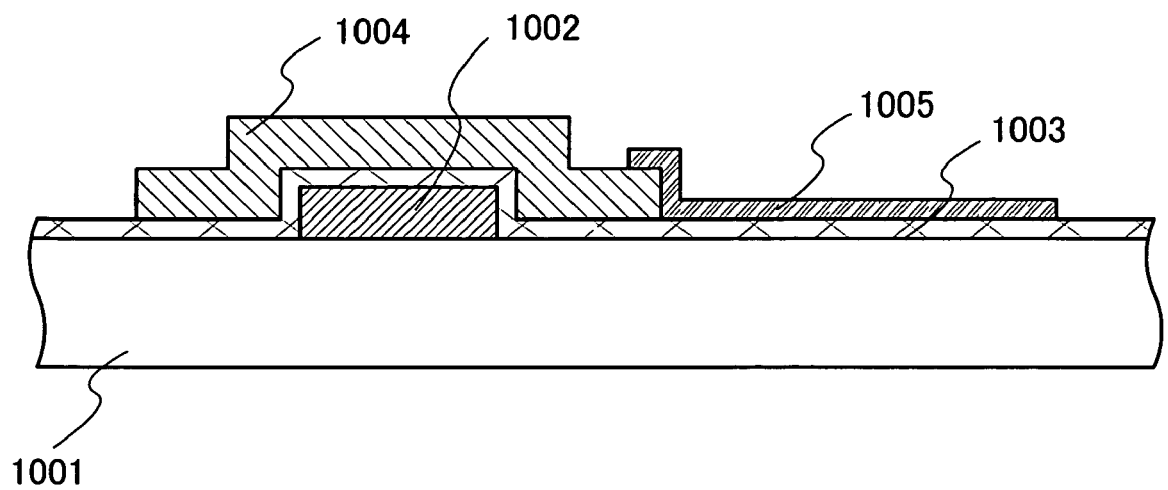
FIG. 14 is a cross sectional view of a conventional MIM switching element.

Arrhenius plots of the elements 2 to 6 at 1V are shown in FIG. 13. It is known that plots of each element are almost on a straight line. Moreover, the plots of each of the elements 2 to 5 in the case of applying forward bias voltage thereto and the plots of each of the elements 2 to 5 in the case of applying reverse bias voltage thereto are almost on the same straight line. Accordingly, it is thought that barriers exist in interfaces in the elements 2 to 5 regardless of the forward bias voltage and reverse bias voltage.

On the other hand, with respect to the element 6 only containing molybdenum oxide, a straight line of the plots when applying forward bias voltage to the element 6 is not overlapped with a straight line of the plots when applying reverse bias voltage thereto. Accordingly, it is thought that a barrier exists at an interface of the forward bias or the reverse bias.

Satisfying the equation 1 indicates that the composite material of the present invention makes ohmic contact to an electrode so that an nonlinear element, which can be driven at low voltage, can be provided by using the composite material.

Further, it is known that since the composite material makes ohmic contact to an electrode, various kinds of materials can be used for the electrode.

Moreover, in a nonlinear element of the present invention, a voltage-current characteristic in the case of applying forward bias voltage to the nonlinear element and a voltage-current characteristic in the case of applying reverse bias voltage thereto exhibit the same nonlinear behavior, and therefore, flicker and the like, which are caused by a difference in transmittance when inverting voltage applied to a liquid crystal, can be prevented.

Moreover, since resistance of the nonlinear element used in the present invention is less affected by variations in thickness of a composite material, variations in characteristics of the nonlinear element can be prevented, making it possible to improve reliability. This application is based on Japanese Patent Application serial no. 2005-082515 filed in Japan Patent Office on March, 22, in 2005, the entire contents of which are hereby incorporated by reference.

What is claimed is:

1. A display device comprising:
an insulating substrate;
a nonlinear element formed over the insulating substrate;
a pixel electrode electrically connected to the nonlinear element;
an orientation film over and in contact with the pixel electrode;
a liquid crystal formed over the pixel electrode; and
a counter substrate formed over the liquid crystal so as to face the insulating substrate;
wherein the nonlinear element comprises:
a first electrode formed over the insulating substrate,
a first layer including a first composite material containing an organic compound and an inorganic compound, formed over the first electrode,
a second layer including a second composite material containing an organic compound and an inorganic compound, formed over the first layer, and
a second electrode formed over the second layer,
wherein a concentration ratio between the organic compound and the inorganic compound of the second layer is different from a concentration ratio between the organic compound and the inorganic compound of the first layer.

2. A display device comprising:
an insulating substrate;
a nonlinear element formed over the insulating substrate;
a pixel electrode electrically connected to the nonlinear element;
an orientation film over and in contact with the pixel electrode;
a liquid crystal formed over the pixel electrode; and
a counter substrate provided over the liquid crystal so as to face the insulating substrate;
wherein the nonlinear element comprises;
a first electrode formed over the insulating substrate;
a layer including a first composite material containing an organic compound and an inorganic compound, formed over the first electrode; and
a second electrode formed over the layer.

3. The display device according to claim 1, wherein the inorganic compound exhibits an electron accepting property with respect to the organic compound.

4. The display device according to claim 1, wherein the inorganic compound is transition metal oxide.

5. The display device according to claim 1, wherein the inorganic compound is one or more material selected from the group consisting of titanium oxide, vanadium oxide, molybdenum oxide, tungsten oxide, rhenium oxide, ruthenium oxide, indium tin oxide, zinc oxide, chromium oxide, zirconium oxide, hafnium oxide, tantalum oxide, and silver oxide.

6. The display device according to claim 1, wherein the organic compound has a hole transporting property.

7. The display device according to claim 1, wherein the organic compound is one or more material selected from the group consisting of 4,4'-bis[N-(9,9-dimethylfluorene-2-yl)-N-phenylamino]biphenyl, 4,4'-bis[N-(4-biphenylyl-N-phenylamino]biphenyl, 1,5-bis(diphenylamino) naphthalene, 4,4',4''-tris(N,N-diphenylamino) triphenylamine, 4,4',4''-tris[N-(3-methylphenyl)-N-phenylamino]triphenylamine.

8. The display device according to claim 1, wherein a distance between the first electrode and the second electrode is 10 nm or more and 500 nm or less.

9. The display device according to claim 1, wherein the insulating substrate comprises a material selected from the group consisting of glass, plastic, and quartz.

10. The display device according to claim 2, wherein the inorganic compound exhibits an electron accepting property with respect to the organic compound.

11. The display device according to claim 2, wherein the inorganic compound is transition metal oxide.

12. The display device according to claim 2, wherein the inorganic compound is one or more material selected from the group consisting of titanium oxide, vanadium oxide, molybdenum oxide, tungsten oxide, rhenium oxide, ruthenium oxide, indium tin oxide, zinc oxide, chromium oxide, zirconium oxide, hafnium oxide, tantalum oxide, and silver oxide.

13. The display device according to claim 2, wherein the organic compound has a hole transporting property.

14. The display device according to claim 2, wherein the organic compound is one or more material selected from the group consisting of 4,4'-bis [N-(9,9-dimethylfluorene-2-yl)-N-phenylamino]biphenyl, 4,4'-bis[N-(4-biphenylyl)-N-phenylamino]biphenyl, 1,5-bis(diphenylamino) naphthalene, 4,4',4"-tris(N,N-diphenylamino) triphenylamine, 4,4',4"-tris [N-(3-methylphenyl)-N-phenylamino]triphenylamine.

15. The display device according to claim 2, wherein a distance between the first electrode and the second electrode is 10 nm or more and 500 nm or less.

16. The display device according to claim 2, wherein the insulating substrate comprises a material selected from the group consisting of glass, plastic, and quartz.

17. A display device comprising:
an insulating substrate;
a nonlinear element formed over the insulating substrate;
a pixel electrode electrically connected to the nonlinear element;
an orientation film over and in contact with the pixel electrode;
a liquid crystal formed over the pixel electrode;
a counter electrode over the liquid crystal; and
a counter substrate formed over the counter electrode so as to face the insulating substrate;
wherein the nonlinear element comprises:
a first electrode formed over the insulating substrate,
a first layer including a first composite material containing an organic compound and an inorganic compound, formed over the first electrode,
a second layer including a second composite material containing an organic compound and an inorganic compound, formed over the first layer, and
a second electrode formed over the second layer,
wherein the first electrode comprises a first metal,
wherein the second electrode comprises a second metal,
wherein voltage is applied to the liquid crystal between the pixel electrode and the counter electrode, and
wherein a concentration ratio between the organic compound and the inorganic compound of the second layer is different from a concentration ratio between the organic compound and the inorganic compound of the first layer.

18. A display device comprising:
an insulating substrate;
a nonlinear element formed over the insulating substrate;
a pixel electrode electrically connected to the nonlinear element;
an orientation film over and in contact with the pixel electrode;
a liquid crystal formed over the pixel electrode;
a counter electrode over the liquid crystal; and
a counter substrate provided over the counter electrode so as to face the insulating substrate;
wherein the nonlinear element comprises:
a first electrode formed over the insulating substrate;
a layer including a first composite material containing an organic compound and an inorganic compound, formed over the first electrode;
a second electrode formed over the layer,
wherein the first electrode comprises a first metal,
wherein the second electrode comprises a second metal, and
wherein voltage is applied to the liquid crystal between the pixel electrode and the counter electrode.

19. The nonlinear element according to claim 17, wherein the inorganic compound exhibits an electron accepting property with respect to the organic compound.

20. The nonlinear element according to claim 17, wherein the inorganic compound is transition metal oxide.

21. The nonlinear element according to claim 17, wherein the inorganic compound is one or more material selected from the group consisting of titanium oxide, vanadium oxide, molybdenum oxide, tungsten oxide, rhenium oxide, ruthenium oxide, indium tin oxide, zinc oxide, chromium oxide, zirconium oxide, hafnium oxide, tantalum oxide, and silver oxide.

22. The nonlinear element according to claim 17, wherein the organic compound has a hole transporting property.

23. The nonlinear element according to claim 17, wherein the organic compound is one or more material selected from the group consisting of 4,4'-bis[N-(9,9-dimethylfluorene-2-yl)-N-phenylamino]biphenyl, 4,4'-bis[N-(4-biphenylyl)-N-phenylamino]biphenyl, 1,5-bis(diphenylamino) naphthalene, 4,4',4"-tris(N,N-diphenylamino)triphenylamine, 4,4',4"-tris[N-(3-methylphenyl)-N-phenylamino]triphenylamine.

24. The nonlinear element according to claim 17, wherein a distance between the first electrode and the second electrode is 10 nm or more and 500 nm or less.

25. A nonlinear element substrate comprising the nonlinear element according to claim 17, provided over an insulating substrate.

26. The nonlinear element according to claim 17, wherein the first metal is one selected from the group consisting of gold, platinum, nickel, tungsten, chromium, molybdenum, iron, cobalt, titanium, copper, palladium, aluminum, and
wherein the second metal is one selected from the group consisting of lithium, cesium, magnesium, calcium, strontium, aluminum and silver.

27. The nonlinear element according to claim 18, wherein the inorganic compound exhibits an electron accepting property with respect to the organic compound.

28. The nonlinear element according to claim 18, wherein the inorganic compound is transition metal oxide.

29. The nonlinear element according to claim 18, wherein the inorganic compound is one or more material selected from the group consisting of titanium oxide, vanadium oxide, molybdenum oxide, tungsten oxide, rhenium oxide, ruthenium oxide, indium tin oxide, zinc oxide, chromium oxide, zirconium oxide, hafnium oxide, tantalum oxide, and silver oxide.

30. The nonlinear element according to claim 18, wherein the organic compound has a hole transporting property.

31. The nonlinear element according to claim 18, wherein the organic compound is one or more material selected from the group consisting of 4,4-bis[N-(9,9-dimethylfluorene-2-yl)-N-phenylamino]biphenyl, 4,4'bis[N-(4-biphenylyl)-N-phenylamino]biphenyl, 1,5-bis(diphenylamino) naphthalene, 4,4',4"-tris(N,N-diphenylamino)triphenylamine, 4,4',4"-tris[N-(3-methylphenyl)-N-phenylamino] triphenylamine.

32. The nonlinear element according to claim 18, wherein a distance between the first electrode and the second electrode is 10 nm or more and 500 nm or less.

33. A nonlinear element substrate comprising the nonlinear element according to claim 18, provided over an insulating substrate.

34. The nonlinear element according to claim 18, wherein the first metal is one selected from the group consisting of gold, platinum, nickel, tungsten, chromium, molybdenum, iron, cobalt, titanium, copper, palladium, aluminum and
wherein the second metal is one selected from the group consisting of lithium, cesium, magnesium, calcium, strontium, aluminum and silver.

* * * * *

UNITED STATES PATENT AND TRADEMARK OFFICE
CERTIFICATE OF CORRECTION

PATENT NO. : 7,626,198 B2
APPLICATION NO. : 11/371520
DATED : December 1, 2009
INVENTOR(S) : Hirakata et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 370 days.

Signed and Sealed this

Second Day of November, 2010

David J. Kappos
*Director of the United States Patent and Trademark Office*